US007503706B2

(12) United States Patent
Wipiejewski et al.

(10) Patent No.: US 7,503,706 B2
(45) Date of Patent: Mar. 17, 2009

(54) MSM PHOTODETECTOR ASSEMBLY

(75) Inventors: Torsten Wipiejewski, Hong Kong (CN); Allan Hui, Hong Kong (CN); Frank Tong, Hong Kong (CN)

(73) Assignee: SAE Magnetics (Hong Kong) Limited, Hong Kong (CN)

( * ) Notice: Subject to any disclaimer, the term of this patent is extended or adjusted under 35 U.S.C. 154(b) by 0 days.

(21) Appl. No.: 10/655,752

(22) Filed: Sep. 5, 2003

(65) Prior Publication Data

US 2005/0053335 A1    Mar. 10, 2005

(51) Int. Cl.
*G02B 6/12* (2006.01)
*G02B 6/26* (2006.01)

(52) U.S. Cl. .................. 385/89; 385/14; 385/15
(58) Field of Classification Search .......... 385/89, 385/14, 15
See application file for complete search history.

(56) References Cited

U.S. PATENT DOCUMENTS

| 5,768,002 | A  | * | 6/1998  | Puzey ........................ 359/245 |
| 6,239,422 | B1 |   | 5/2001  | Vang et al. |
| 6,854,901 | B1 | * | 2/2005  | Ouchi ........................ 385/89 |
| 6,975,812 | B1 | * | 12/2005 | Kuhara et al. ................ 398/21 |
| 2003/0113078 | A1 | * | 6/2003 | Tatum .......................... 385/94 |
| 2003/0152336 | A1 | * | 8/2003 | Gurevich et al. ............... 385/88 |
| 2004/0105364 | A1 | * | 6/2004 | Chow et al. .............. 369/47.19 |
| 2004/0121507 | A1 | * | 6/2004 | Bude et al. .................... 438/93 |
| 2004/0146253 | A1 | * | 7/2004 | Wang et al. ................... 385/93 |
| 2005/0058389 | A1 | * | 3/2005 | Ouchi ........................ 385/14 |
| 2006/0110104 | A1 | * | 5/2006 | Sakai .......................... 385/33 |

OTHER PUBLICATIONS

Lang., M. et al., "Complete monolithic integrated 2.5 Gbit/s optoelectronic receiver with large area MSM photodiode for 850 nm wavelength", Electronics Letters, vol. 37, No. 20, Sep. 27, 2001, 2 pages.
Hurm., V. et al., "Large area MSM photodiode array for 0.85 μm wavelength 10 Gbit/s per channel parallel optical links", Electronics Letters, vol. 38, No. 18, Aug. 19, 2002, 2 pages.
"Latest developments of plastic optical fiber" OME Information No. 3, 2002; 1 page & English translation 2 pages.
Jingping et al., "Single chip integrated MSM/HEMT long wave optical receiver", Journal of Opo Electronics Laser, vol. 1 11, No. 3, Jun. 2000; 2 pages & English translation 3 pages.
Office Action issued for Chinese Patent Application No. 200410047154.2; 5 pages & English Translation-7 pages.

* cited by examiner

*Primary Examiner*—K. Cyrus Kianni
(74) *Attorney, Agent, or Firm*—Fulbright & Jaworski L.L.P.

(57) ABSTRACT

One embodiment of the invention uses an MSM photodetector that is coupled to a relatively large core optical waveguide, e.g. an HCS fiber or a plastic optical fiber (POF). The MSM photodetector with its low capacitance enables high speed data transmission using large core optical waveguides.

58 Claims, 3 Drawing Sheets

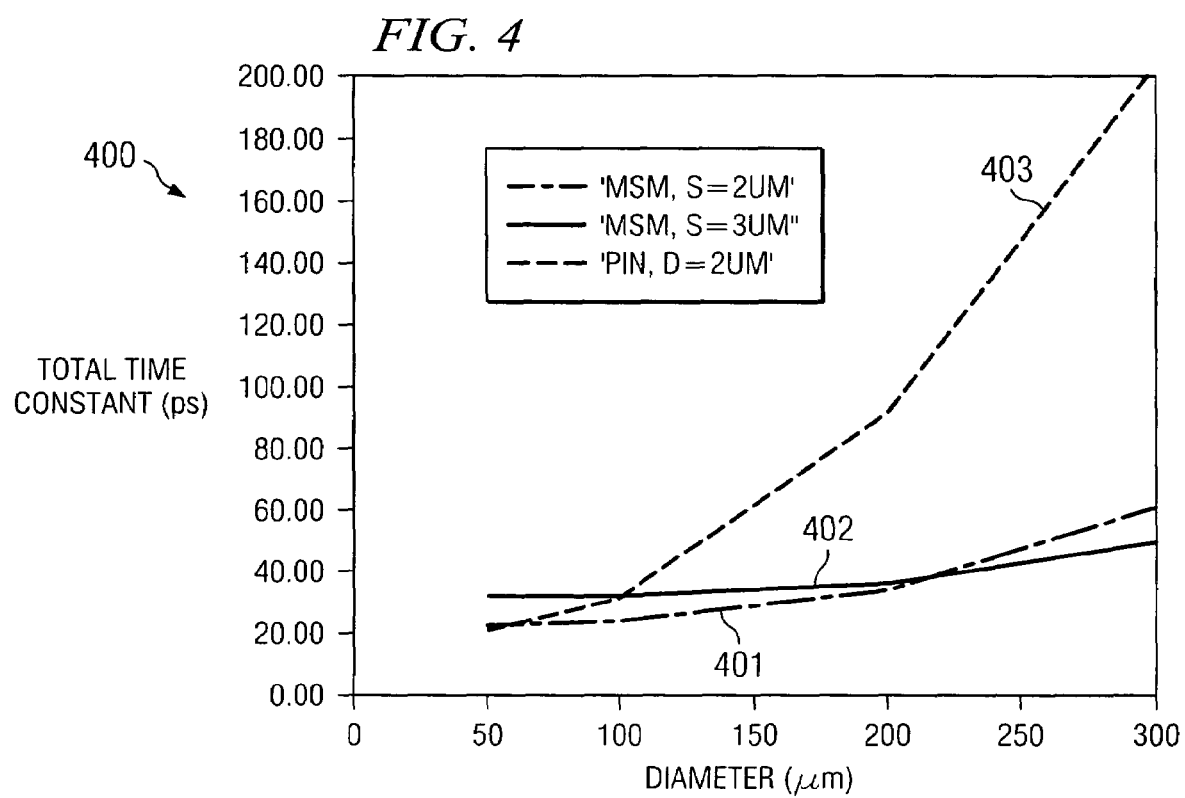

MSM PHOTODETECTOR ASSEMBLY

FIELD OF THE INVENTION

This application relates in general to optical communication, and in specific to an assembly for an MSM photodetector.

BACKGROUND OF THE INVENTION

Optical fiber technology is well suited for communications applications because optical fibers have a wide transmission bandwidth and relatively low attenuation. However, optical fiber interfaces to electronic and optical networks are expensive to manufacture because of the difficulty associated with mounting laser transmitting and receiving devices onto substrates and aligning them with separately mounted optical fibers. The difficulties generally are associated with manufacturing components with precise tolerances and mounting components at precise locations within precise tolerances. The challenges of alignment are typically faced during the packaging of the devices. To overcome these difficulties, the transmitter and receiver devices can be enlarged so as to alleviate the tight tolerances that are difficult to achieve during alignment.

In a conventional optical fiber communications system, a transmitter sends optical data into a fiber, and the data is received by a detector at the receiving end. Two inherent interfaces exist at both ends of the fiber. Minimizing the optical loss at these two interfaces is difficult due to the alignment at the micron scale. Alleviating the alignment tolerance at the transmission end can be done by enlarging the core of the optical fiber. However, this has an undesirable effect at the receiving end interface. Namely, the light that exits a larger core fiber has a larger cross-sectional area, thereby making it difficult to capture the light.

Large core fibers, e.g. fibers with core diameters of 50 to 63 microns, are typically found in local area network (LAN) environments. The large cores provide more tolerances for installation than smaller core fibers, e.g. coupling the fiber to a source laser or a receiving photodetector, as well as coupling fibers together with an optical connector. Two types of photodetectors are typically used to receive the light from the fiber and convert the light into an electrical signal, namely a PN diode and a metal semiconductor metal (MSM) diode. Both are currently made to be about 70 to 80 microns in diameter, so as to capture the light from the LAN fibers.

Another type of fiber is being used in limited applications, namely the hard clad silica fiber (HCS) fiber. This fiber has a silicon core surrounded by a hard plastic cladding and has diameters of typically 200-300 microns.

A further type of fiber is a plastic fiber. This fiber is similar to the HCS fiber, but uses a plastic core instead of a silica core. Since the core is plastic, the attenuation of the fiber limits effective use of the fiber to distances of 10 meters or less.

Accordingly, there is a need for an optical receiving assembly that incorporates all the necessary optical and electrical components to capture the light exiting the large area fiber of a low cost platform.

BRIEF SUMMARY OF THE INVENTION

Embodiments of the present invention are directed to a system and method which is associated with an optical-to-electrical signal conversion device used for receiving data in communications. Embodiments of the invention are particularly low cost in packaging due to their formation in a resin molded leadframe with integrated optical and electrical components. Embodiments of the invention use a large, high speed photodetector with a large diameter fiber.

According to the present invention, a large area metal-semiconductor-metal (MSM) photodetector(s) is used to capture the light exiting a large optical fiber inside a connectorized package assembly. The inventive MSM photodetector can receive a single optical channel using a single detector or multiple optical channels using an array of detectors. The MSM photodetector converts the optical signal into electrical signal, in each respective channel. The electrical signal is amplified via an integrated circuit chip or a separate discrete chip inside the same package.

In one embodiment of the present invention, a single or array of fibers is held in place by an external connector. The external connector positions the fibers perpendicular or parallel to the detector surface. Alignment for coupling into the detector is done by the mating of the connector to the assembly. In the perpendicular configuration, the fibers allow the exiting light to be captured with or without focusing elements. In the parallel configuration, the connector reflects the light in an angle that allows the capturing of the light. The reflecting surface in the connector may or may not contain a focusing element. According to another embodiment of the present invention, a substrate is provided for mating optical components with an optical connector body.

Embodiments of the invention use a large optical fiber of 100 microns or greater, e.g. 100, 200, or 400 microns, that may be an HCS fiber or a plastic fiber. The MSM photodetector would be appropriately sized for the fiber. Embodiments of the invention may include a lens to focus the light onto the detector. This would allow a detector that is smaller than the diameter of the fiber. Embodiments of the invention have the photodetector mounted an a substrate, e.g. a printed circuit board, a lead frame substrate, a RF ceramic substrate, or a silicon substrate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 4 is a graph comparing MSM photodetectors and a pin photodiode.

DETAILED DESCRIPTION OF THE INVENTION

Embodiments of the invention would operate in situations that need short, high speed optical data links, e.g. 30 meters or less. For example, embodiments of the inventor could be used in entertainment systems, computer systems, automotive systems, transportation systems, storage systems, industrial systems, aviation systems, multimedia systems, information technology systems, etc. For example, embodiments of the invention could link two computer systems together, connect a DVD player to a TV (which may be located in a building, car, train, airplane, or other transportation system), connect a tuner/control unit to a large panel TV monitor, link a game controller to a game box, connect a house hold appliance (e.g. a TV, stereo, telephone, computer, camera, etc.) to a control system, connect a digital camera to storage or control system or a display screen, connect a sensor to a computer, connect a control mechanism to a computer, connect a computer to a projector or monitor, or connect devices to a multiplexer or demultiplexer. Furthermore, embodiments of the invention may be used with large screen devices like high definition TV (HDTV) sets that use high speed connections to the control unit.

Figure 1:
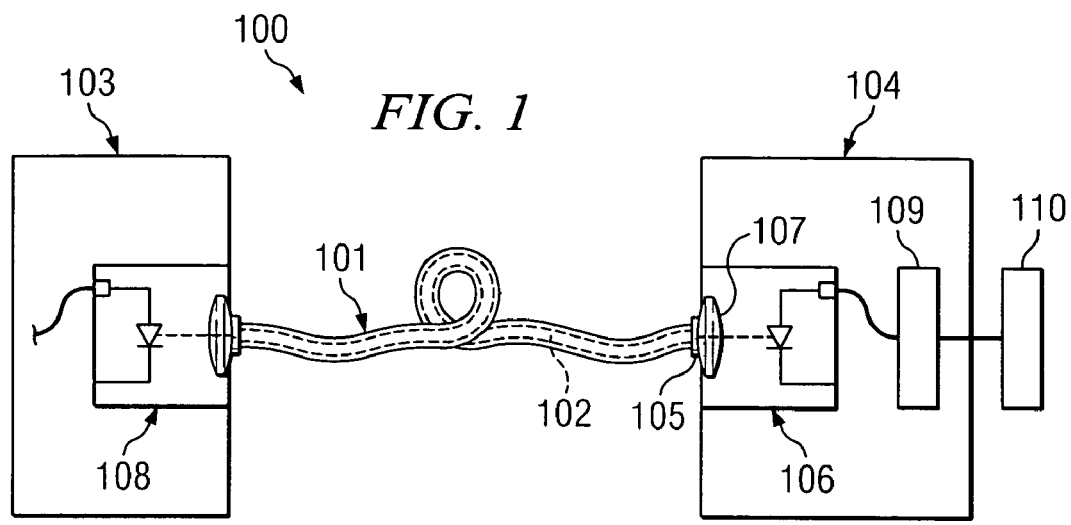
FIG. 1 is a schematic of an optical system using an embodiment of the invention.

FIG. 1 depicts an arrangement for an optical communications system 100 using an embodiment of the invention. The system 100 includes an optical fiber 101 that has a core diameter of 100 microns or larger, e.g. 100, 200, 400, 800, 1000 microns, or 100-1000 microns. The fiber may be a plastic optical fiber (POF) or a HCS fiber. The core of the fiber 102 would carry the optical light signal. The system may include one fiber or a plurality of fibers. Note that the large fiber diameter is desired, because it allows for higher installation tolerances. In other words, the larger the diameter, the looser the alignment tolerance on coupling, which allows for a cheaper coupling to be used.

System 100 uses transmitter 103 to generate and couple the light used for the signal into the fiber. The transmitter 103 would form modulated light which is then coupled into this optical fiber. This light would carry information through the fiber 101 in the form of light pulses. The light may be formed by laser 108, which may a diode laser, in the form of a Fabry-Perot (FP) laser, or a vertical-cavity surface-emitting laser VCSEL. The light source could also be a high speed light emitting diode (LED). Typically, the light generated will have a wavelength from 500-1550 nanometers. Most systems will operate at around 650 nm, 780 nm, or 850 nm wavelengths.

The light pulses would be detected by the receiver 104. The receiver 104 is coupled to the fiber 101 with an optical connector 105. For some applications the connector might be omitted, and the fiber would be permanently attached to the photodiode. The receiver includes photodetector 106, which may be an MSM photodetector. The photodetector would then convert the light signal into an electrical signal. The electrical signal may then be sent to another receiver component 109, e.g. an amplifier, filter, and/or other processing component, and/or the signal is (then) sent to off-receiver component 110, which may be an amplifier, filter, and/or other processing element, including a transmitter for another fiber. The photodetector would be sized as appropriate for the fiber, e.g. for a 100 micron fiber, the photodetector would be either 100 microns or slightly larger.

Optionally, the receiver 104 may include lens 107 which would focus the light onto the photodetector. This would allow the photodetector to be smaller than the fiber diameter and still receive all of the light from the fiber. However, there is a limit as to the reduction in size that is possible with using a lens. The phase space product of the light needs to be conserved, which means that the product of the numerical aperture of the fiber times the area of the fiber has to be a constant. Thus, to shrink the area of the photodetector, the numerical aperture of the light shining onto the photodetector needs to be increased, which has a fundamental limit of 1. Therefore, the light out of the fiber cannot be focused down to a single spot. A reduction of 50% might be feasible with carefully designed optics.

An MSM photodetector is preferably over a p-intrinsic-n (PIN) photodetector. As the size of a PIN-type photodetector is increased, the capacitance is increased, effectively lowering the bandwidth or speed of the system. Thus, for speeds of more than 1 gigabit per second, the typical diameter of a PIN photodetector would have to be less than 100 micrometers. Because of the geometrical configuration of the MSM photodetector, it has much lower capacitance than a PIN photodetector of the same size. Thus, the MSM photodetector may be larger than 100 micrometers and still allow for speeds in excess of 1 gigabit per second.

The graph 400 in FIG. 4 shows a comparison of the calculated time constants of two MSM photodetectors with an electrode spacing of 2 μm (401) and 3 μm (402) respectively, and a pin photodiode (403) with an absorbing layer thickness of 2 μm. Note that the MSM detector is significantly faster for diameters of 150 μm and above. For smaller diameters the drift time is more dominant, and therefore, the speed of the pin-diode is comparable with the MSM detector.

An MSM photodetector may comprise gallium arsenide that is basically undoped. Typical metal for the electrodes may be platinum with a gold layer on top A titanium layer beneath improves the adhesion to the semiconductor. Thicknesses of the titanium would be in the range of 20 nanometers, the platinum would be typically 100 to 200 nanometers and the gold layer typically would be another 200 nanometers to 1 micron. The purpose of the electrodes is to collect the carriers generated in the semiconductor. The electrodes also form a Schottky barrier to the semiconductor. The width of the electrodes would be as small as possible in order to have the least amount of light blocking. The typical width of these electrodes is in the range of 1 micron or lower, e.g. 0.7 microns. The space in between the two electrodes on the top surface would need to be optimized for the specific application of the photodetector. The longer the distance the more voltage is needed to operate the device. Typical distances between the electrodes is 1 to 3 microns. MSM photodetectors may also have an anti-reflective (AR) coating on the top surface to minimize light loss due to reflection at the surface. The AR coating layer is adjusted to a quarter wave length thickness and the effective index is the geometrical average between the air (or other encapsulant) and the semiconductor. The typical number for the effective index is 1.9.

Figure 2:
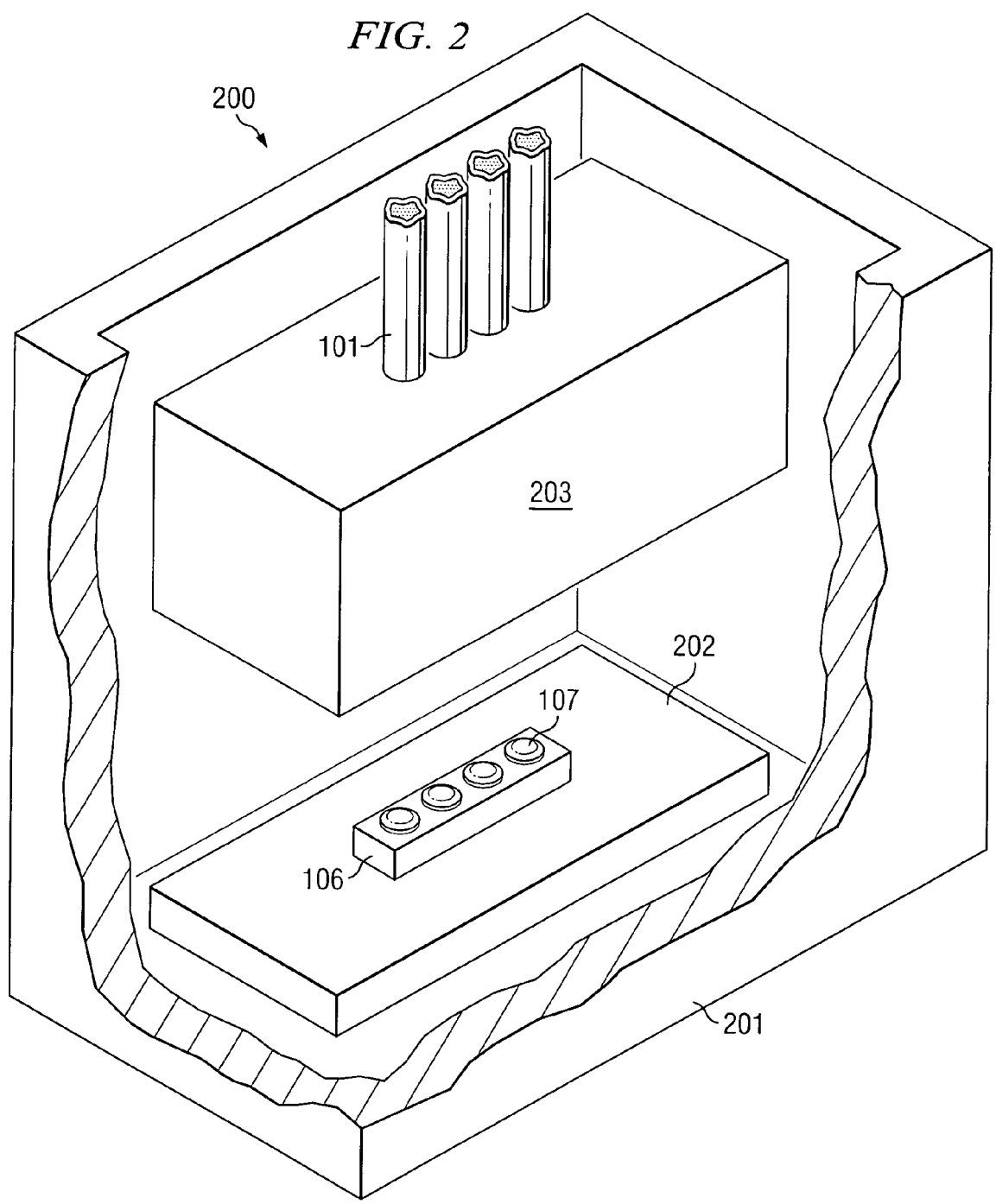
FIG. 2 is a schematic of an example of a connector and photodetector according to embodiments of the invention.

FIG. 2 depicts an example of an exploded view of a MSM photodetector and a connector 201 according to embodiments of the invention. This arrangement 200 includes a plurality of fibers 101, the light from which is received by an array of photodetectors 106. The fibers are arranged and maintained in the arrangement by holder 203. A plurality of lenses 107 focus the light onto the array of photodetectors 106. The lenses 107 may be separate from the array or they may be integrated with the array. The array is attached to a substrate 202, which can be a PCB, a silicon substrate, a ceramic substrate, a dielectric substrate, or a metal frame substrate. The fiber holder 203 would then be coupled to the connector 201, and the connection would align, within an acceptable tolerance, the fibers with the photodetectors. Note that more or fewer fibers can be used, e.g. 1, 4, 8, 12, or 36.

Figure 3:
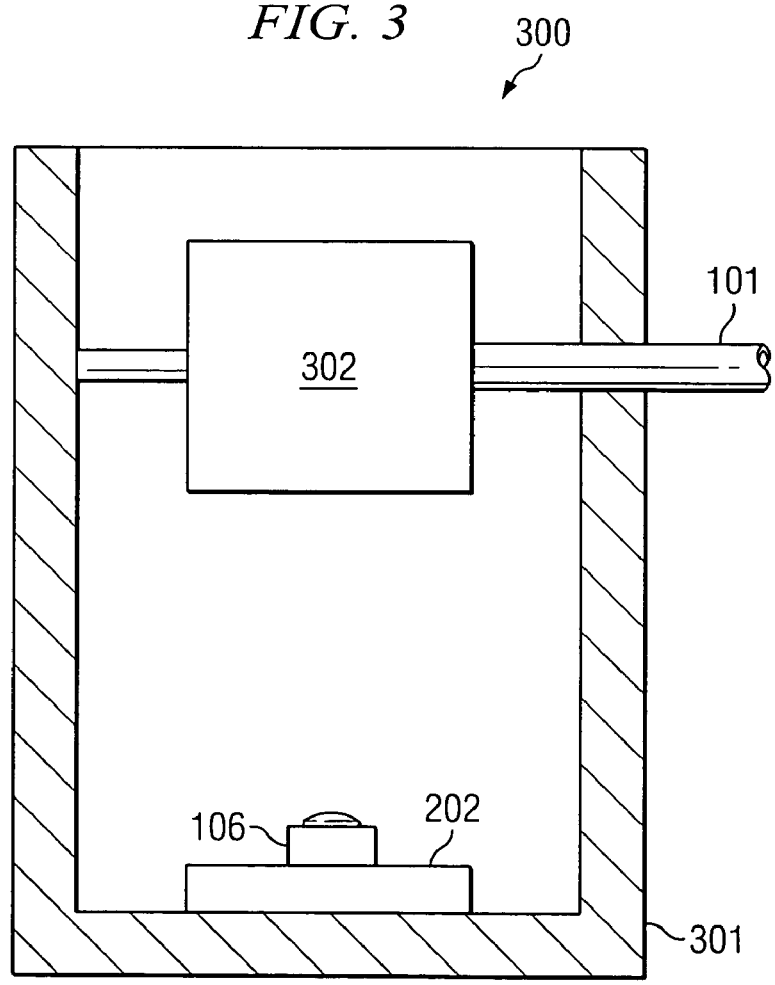
FIG. 3 is a schematic of another example of a connector and photodetector according to embodiments of the invention.

FIG. 3 depicts an arrangement 300 similar to that of FIG. 2, but uses element 302 that reflects the light at an angle with respect to the direction of its entrance into the connector 301. Note that element 302 may also focus the light as with lens 107, in addition to changing its direction. Further note that the 90 degree change is by way of example only as other angles could be used.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system comprising:
   an optical waveguide having a diameter that is greater than 100 microns and transports a light signal;
   a metal semiconductor metal (MSM) photodetector that receives the light signal from the optical fiber, and converts the light into an electrical signal; and
   a reflector that reflects the light signal onto the MSM photodetector at 90 degrees angle with respect to a direction of the light signal as it exits the optical waveguide;
   wherein the system has a data rate of at least 500 Megabit per second.

2. The system of claim 1, wherein the system has a data rate of at least 1 Gigabit per second.

3. The system of claim 1, wherein the optical waveguide is an optical fiber.

4. The system of claim 3, wherein the optical fiber is a silica fiber.

5. The system of claim 3, wherein the optical fiber is a hard clad silica fiber.

6. The system of claim 3, wherein the optical fiber is a plastic optical fiber.

7. The system of claim 1, wherein the MSM photodetector has a GaAs substrate.

8. The system of claim 1, wherein the MSM photodetector has an InP substrate.

9. The system of claim 1, wherein the MSM photodetector has one of a GaN, a Sapphire, and a SiC substrate.

10. The system of claim 1, wherein the optical waveguide has an optical axis that is parallel to an optical axis of the MSM photodetector.

11. The system of claim 1, further comprising:
    a lens that focuses the light signal onto the MSM photodetector,
    wherein the MSMS photodetector has a diameter that is less than the diameter of the optical waveguide.

12. The system of claim 1, wherein the reflector focuses the light signal onto the MSM photodetector, and the MSM photodetector has a diameter that is less than the diameter of the optical waveguide.

13. The system of claim 1, wherein the optical waveguide is one fiber of a plurality of optical waveguides, and the MSM photodetector is one MSM photodetector of a plurality of photodetectors, wherein a respective optical waveguide is associated with a respective MSM photodetector.

14. The system of claim 1, wherein the optical waveguide has a length of less than 30 meters.

15. The system of claim 1, wherein the system is associated with one of an entertainment system, a computer system, an automotive system, a transportation system, and a storage system, an industrial system, an aviation system, a multimedia system, and an informational technology system.

16. The system of claim 1, wherein the system connects a signal provider to an receiving unit.

17. The system of claim 16, wherein the signal provider is selected from the group consisting of:
    a cable system, DVD player, video cassette player, a CD player, a controller, a sensor, communications system, a data storage device, and a multiplexer.

18. The system of claim 16, wherein the receiving unit is selected from the group consisting of:
    stereo system, a television, a computer, a personal data assistant, game system, telephone, a household appliance, a display screen, a control system, a demultiplexer, and a digital recorder.

19. The system of claim 1, wherein the optical waveguide has a diameter of one of 100 microns, 200 microns, 400 microns, 800 microns, and 1000 microns.

20. The system of claim 1, wherein the optical waveguide has a diameter of between 100-1000 microns.

21. The system of claim 1, further comprising:
    a substrate upon which the MSM photodetector is mounted.

22. The system of claim 21, wherein the substrate is one of a printed circuit board, a lead frame substrate, a RF ceramic substrate, and a silicon substrate.

23. A data transmission system comprising:
    a transmitter that provides an optical signal that is transported on an optical waveguide having a diameter that is greater than 100 microns, wherein the optical signal has a data rate of at least 500 Megabit per second for a portion of time;
    a receiver that receives the optical signal and converts the optical signal into an electrical signal, wherein the receiver comprises a metal semiconductor metal (MSM) photodetector;
    a reflector that reflects the optical signal onto the MSM photodetector at 90 degrees angle with respect to a direction of the optical signal as it exits the optical waveguide; and
    a connector that couples the receiver to the optical waveguide.

24. The system of claim 23, wherein the system has a data rate of at least 1 Gigabit per second.

25. The system of claim 23, wherein the optical waveguide is an optical fiber.

26. The system of claim 25, wherein the optical fiber is a silica fiber.

27. The system of claim 25, wherein the optical fiber is a hard clad silica fiber.

28. The system of claim 25, wherein the optical fiber is a plastic optical fiber.

29. The system of claim 23, further comprising:
a lens that focuses the optical signal onto the MSM photodetector,
wherein the MSM photodetector has a diameter that is less than the diameter of the optical waveguide.

30. The system of claim 23, wherein the optical waveguide has an optical axis that is parallel to an optical axis of the MSM photodetector.

31. The system of claim 23, wherein the reflector focuses the optical signal onto the MSM photodetector, and the MSM photodetector has a diameter that is less than the diameter of the optical waveguide.

32. The system of claim 23, wherein the optical waveguide is one fiber of a plurality of optical waveguides, and the MSM photodetector is one MSM photodetector of a plurality of photodetectors, wherein a respective optical waveguide is associated with a respective MSM photodetector.

33. The system of claim 23, wherein the optical waveguide has a length of less than 30 meters.

34. The system of claim 23, wherein the system is associated with one of an entertainment system, a computer system, an automotive system, a transportation system, and a storage system, an industrial system, an aviation system, a multimedia system, and an informational technology system.

35. The system of claim 23, wherein the transmitter is selected from the group consisting of:
a cable system, DVD player, video cassette player, a CD player, a controller, a sensor, communications system, a data storage device, and a multiplexer.

36. The system of claim 23, wherein the receiver is selected from the group consisting of:
stereo system, a television, a computer, a personal data assistant, game system, telephone, a household appliance, a display screen, a control system, a demultiplexer, and a digital recorder.

37. The system of claim 23, wherein the optical waveguide has a diameter of one of 100 microns, 200 microns, 400 microns, 800 microns, and 1000 microns.

38. The system of claim 23, wherein the optical waveguide has a diameter of 100-1000 microns.

39. The system of claim 23, further comprising:
a substrate upon which the MSM photodetector is mounted.

40. The system of claim 39, wherein the substrate is one of a printed circuit board, a lead frame substrate, a RF ceramic substrate, and a silicon substrate.

41. A connector comprising:
a port for receiving an optical waveguide having a diameter that is greater than 100 microns and transports a light signal, wherein the light signal has a data rate of at least 500 Megabit per second for a portion of time;
a support for a metal semiconductor metal (MSM) photodetector that receives the light signal from the optical fiber, and converts the light into an electrical signal; and
a reflector that reflects the light signal onto the MSM photodetector at 90 degrees angle with respect to a direction of the light signal as it exits the optical waveguide.

42. The connector of claim 41, wherein the optical waveguide is an optical fiber.

43. The connector of claim 42, wherein the optical fiber is a silica fiber.

44. The connector of claim 42, wherein the optical fiber is a hard clad silica fiber.

45. The connector of claim 42, wherein the optical fiber is a plastic optical fiber.

46. The connector of claim 41, further comprising:
a lens that focuses the light signal onto the MSM photodetector,
wherein the MSM photodetector has a diameter that is less than the diameter of the optical waveguide.

47. The connector of claim 41, wherein the optical waveguide has an optical axis that is parallel to an optical axis of the MSM photodetector.

48. The connector of claim 41, wherein the reflector focuses the light signal onto the MSM photodetector, and the MSM photodetector has a diameter that is less than the diameter of the optical waveguide.

49. The connector of claim 41, wherein the optical waveguide is one fiber of a plurality of optical waveguides, and the MSM photodetector is one MSM photodetector of a plurality of photodetectors, wherein a respective optical waveguide is associated with a respective MSM photodetector.

50. The connector of claim 41, wherein the optical waveguide has a length of less than 30 meters.

51. The connector of claim 41, wherein the system is associated with one of an entertainment system, a computer system, an automotive system, a transportation system, and a storage system, an industrial system, an aviation system, a multimedia system, and an informational technology system.

52. The connector of claim 41, wherein the connector connects a signal provider to a receiving unit.

53. The connector of claim 52, wherein the signal provider is selected from the group consisting of:
a cable system, DVD player, video cassette player, a CD player, a controller, a sensor, communications system, a data storage device, and a multiplexer.

54. The connector of claim 52, wherein the receiving unit is selected from the group consisting of:
stereo system, a television, a computer, a personal data assistant, game system, telephone, a household appliance, a display screen, a control system, a demultiplexer, and a digital recorder.

55. The connector of claim 41, wherein the optical waveguide has a diameter of one of 100 microns, 200 microns, 400 microns, 800 microns, and 1000 microns.

56. The connector of claim 41, wherein the optical waveguide has a diameter of 100-1000 microns.

57. The connector of claim 41, wherein the support is a substrate upon which the MSM photodetector is mounted.

58. The connector of claim 57, wherein the substrate is one of a printed circuit board, a lead frame substrate, a RF ceramic substrate, and a silicon substrate.

* * * * *